(12) United States Patent
Hirono

(10) Patent No.: US 7,935,460 B2
(45) Date of Patent: May 3, 2011

(54) MASK BLANK FOR EUV EXPOSURE AND MASK FOR EUV EXPOSURE

(75) Inventor: Masatoshi Hirono, Kanagawa (JP)

(73) Assignees: Kabushiki Kaisha Toshiba, Tokyo (JP); NEC Corporation, Tokyo (JP)

( * ) Notice: Subject to any disclaimer, the term of this patent is extended or adjusted under 35 U.S.C. 154(b) by 206 days.

(21) Appl. No.: 12/209,380

(22) Filed: Sep. 12, 2008

(65) Prior Publication Data

US 2009/0075184 A1    Mar. 19, 2009

(30) Foreign Application Priority Data

Sep. 18, 2007    (JP) ................. 2007-240466

(51) Int. Cl.
*G03F 1/00*    (2006.01)
*B32B 17/10*    (2006.01)

(52) U.S. Cl. .......................................... 430/5; 428/430

(58) Field of Classification Search ...... 430/5; 428/430; 378/34, 35
See application file for complete search history.

(56) References Cited

U.S. PATENT DOCUMENTS

| | | | | |
|---|---|---|---|---|
| 6,720,118 B2 * | 4/2004 | Yan et al. | ........................... | 430/5 |
| 7,348,105 B2 * | 3/2008 | Ishibashi et al. | ................... | 430/5 |
| 2006/0292459 A1 * | 12/2006 | Kamm et al. | ..................... | 430/5 |
| 2007/0160916 A1 * | 7/2007 | Ikuta et al. | ........................ | 430/5 |
| 2007/0259275 A1 * | 11/2007 | Van Herpen et al. | ............. | 430/5 |

FOREIGN PATENT DOCUMENTS

| | | |
|---|---|---|
| JP | 2004-363570 | 12/2004 |
| JP | 2006-228767 | 8/2006 |
| JP | 2007-86100 | 4/2007 |
| JP | 2007-88414 | 4/2007 |
| JP | 2007-512702 | 5/2007 |
| WO | WO 2005/050719 A1 | 6/2005 |

* cited by examiner

*Primary Examiner* — Stephen Rosasco
*Assistant Examiner* — Stewart A Fraser
(74) *Attorney, Agent, or Firm* — Oblon, Spivak, McClelland, Maier & Neustadt, L.L.P.

(57) ABSTRACT

Provided are a mask for EUV exposure and a mask blank for EUV exposure for manufacturing the same, so as to improve the contrast of ultraviolet inspection light and improve the inspection performance for the mask. This mask blank for EUV exposure includes a substrate, a reflecting layer which is provided on the substrate and reflects EUV light, and an absorbent layer which is provided on the reflecting layer and absorbs EUV light. Reflectance of light at a wavelength between 150 nm and 300 nm is greater at the absorbent layer than that of the reflecting layer. The mask for EUV exposure can be manufactured by processing this mask blank for EUV exposure.

3 Claims, 5 Drawing Sheets

L/S Half Pitch (μm)

FIG.2B  Related Art

L/S Half Pitch (μm)

Related Art

MASK BLANK FOR EUV EXPOSURE AND MASK FOR EUV EXPOSURE

CROSS-REFERENCE TO RELATED APPLICATION

This application is based upon and claims the benefit of priority from Japanese Patent Applications No. 2007-240466, filed on Sep. 18, 2007, the entire contents of which are incorporated herein by reference.

FIELD OF THE INVENTION

The present invention relates to a mask for EUV exposure for use in manufacturing semiconductor devices, etc. and also a mask blank for EUV exposure for manufacturing the same.

BACKGROUND OF THE INVENTION

As the integration of ICs increases, exposure wavelengths become shorter in lithography. This is because the resolution in the optical exposure generally improves as the exposure wavelengths become short. Recently, the exposure wavelengths have been shortened from a KrF laser of 248 nm to an ArF laser of 193 nm. As the exposure wavelengths in the next-generation lithography, a remarkably shortened wavelength between 12 nm and 15 nm using extreme ultraviolet (hereinafter referred to as EUV) light is promising, rather than 157 nm wavelength using the F2 laser which is originally-promised.

At a wavelength of EUV light, the refraction index for every material is approximately 1, and light is absorbed. Thus, an optical lithographic system cannot be formed of lens and the like previously used, and required to be formed entirely of mirror optical systems. Needless to say, it is necessary that the transmission-type masks previously used as an exposure mask unexceptionally be changed to the reflective type.

For example, a structure including a reflecting layer which is provided on the substrate and reflects EUV light, and an absorbent layer which absorbs EUV light on the reflecting layer is adopted for the mask for EUV exposure. The IC pattern is formed by patterning the absorbent layer on the reflecting layer. Thus, unlike the binary mask or half-tone mask, in the mask for EUV exposure, the reflectance of light for exposure is higher in a part where the patterned film does not exist than in a part where there is patterned film.

The wavelength of the ultraviolet for use in the inspection for a mask for EUV exposure is preferably between 150 nm and 300 nm like the wavelength previously used, from the point of view of continuity of inspecting techniques and unnecessary introduction of a new inspecting apparatus. However, in the mask having optimum reflection characteristics with respect only to EUV light, there is a high chance that no sufficient contrast exists in the ultraviolet inspection light that has different wavelengths. Thus, proposed is a method for increasing the contrast at the inspection and improving the inspection performance for the mask, by providing an antireflection layer with respect to ultraviolet above the absorbent layer (as described, for example, in JP-A 2006-228767 (KOKAI)).

SUMMARY OF THE INVENTION

Even if an antireflection layer with respect to ultraviolet is provided above the absorbent layer, the contrast in the ultraviolet inspection light remarkably decreases when the line and space of the pattern (line widths and line spacing) get narrow as the same order as the wavelength order of the inspection light. The reason for this is as follows. A small amount of inspection light is always reflected on the surface of the pattern (i.e. the surface of the absorbent layer) regardless of the pattern size. In contrast to this, if the space part of the pattern (i.e. the space of the absorbent layer) approaches the wavelength order, the inspection light is hardly reflected at the space part of the pattern in the form of a concave, thus decreasing the difference between the reflectance values of respective positions with and without the absorbent layer.

The present invention has been made in consideration of the above matter. An object thereof is to provide a mask for EUV exposure and a mask blank for EUV exposure for manufacturing the same, so as to improve the contrast with respect to ultraviolet inspection light and to improve the inspection performance for the mask.

According to one aspect of the present invention, a mask blank for EUV exposure includes: a substrate; a reflecting layer which is provided on the substrate and reflects EUV light; and an absorbent layer which is provided on the reflecting layer and absorbs EUV light, and wherein reflectance of light at a wavelength between 150 nm and 300 nm is greater at the absorbent layer than reflectance at the reflecting layer.

According to one aspect of the present invention, a mask for EUV exposure includes: a substrate; a reflecting layer which is provided on the substrate and reflects EUV light; and an absorbent layer which is provided on the reflecting layer and has a predetermined pattern for absorbing EUV light, and wherein reflectance of light at a wavelength between 150 nm and 300 nm is greater at the absorbent layer than reflectance at the reflecting layer.

BRIEF DESCRIPTION OF THE DRAWINGS

FIG. 2A and FIG. 2B are graphs showing simulation results of signal amplitude characteristics of the mask according to the first embodiment and a related art mask.

DETAILED DESCRIPTION OF THE INVENTION

Embodiments of the present invention will now be described with reference to the drawings. In this description, "EUV" light implies light at a wavelength between 12 nm and 15 nm.

First Embodiment

A mask blank (or mask blanks) for EUV exposure of a first embodiment of the present invention includes a substrate, a reflecting layer which is provided on this substrate and reflects EUV light, and an absorbent layer which is provided on the reflecting layer and absorbs EUV light. At the absorbent layer, the reflectance of light at a wavelength between 150 nm and 300 nm is greater than that at the reflecting layer.

A mask for EUV exposure of the first embodiment of the present invention includes a substrate, a reflecting layer which is provided on this substrate and reflects EUV light, and an absorbent layer which is provided on the reflecting layer and has a predetermined pattern for absorbing EUV light. At the absorbent layer, the reflectance of light at a wavelength between 150 nm and 300 nm is greater than that at the reflecting layer. That is, for example, the mask is manufactured by patterning the absorbent layer of the above-described mask blank for EUV exposure in a predetermined pattern.

Unlike the mask blank for EUV exposure previously used, in the mask blank for EUV exposure (hereinafter simply called "mask blank") of this embodiment, the reflectance of ultraviolet rays at a wavelength between 150 nm and 300 nm at the absorbent layer is greater than that at the reflecting layer. Thus, as will specifically be described later, in the mask for EUV exposure (hereinafter simply called "mask") which has been manufactured using the mask blank, when a mask inspection is performed with the ultraviolet ray at a wavelength between 150 nm and 300 nm as inspection light, the contrast with respect to the inspection light improves as compared to the mask previously used. Thus, the inspection accuracy for the small pattern increases, thus enabling to improve inspection performance for the mask.

Figure 1A:
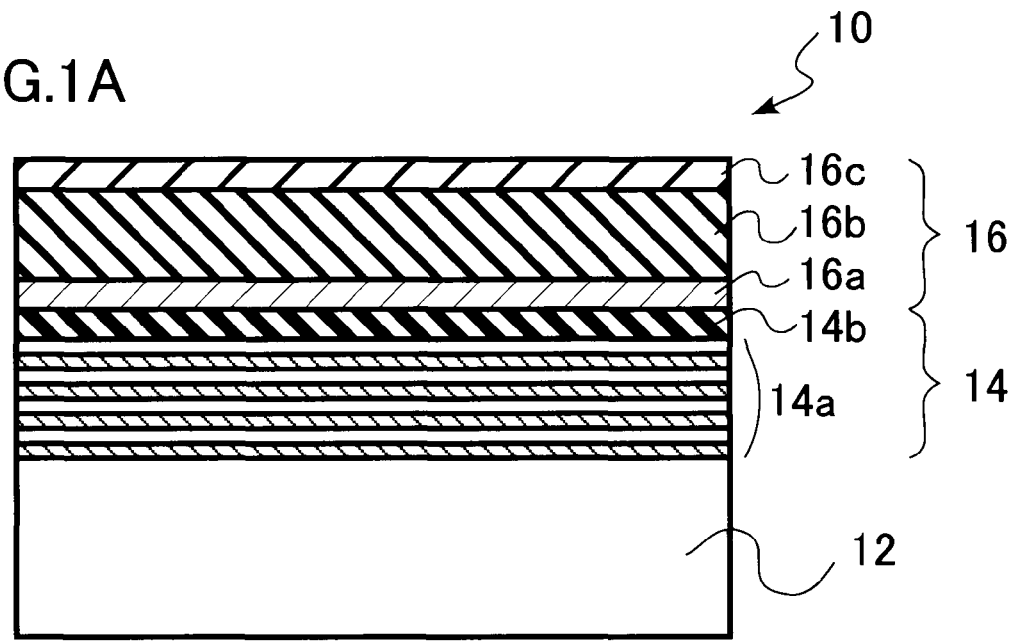
FIG. 1A and FIG. 1B are cross sectional diagrams of a mask blank and mask according to a first embodiment.
Figure 1B:
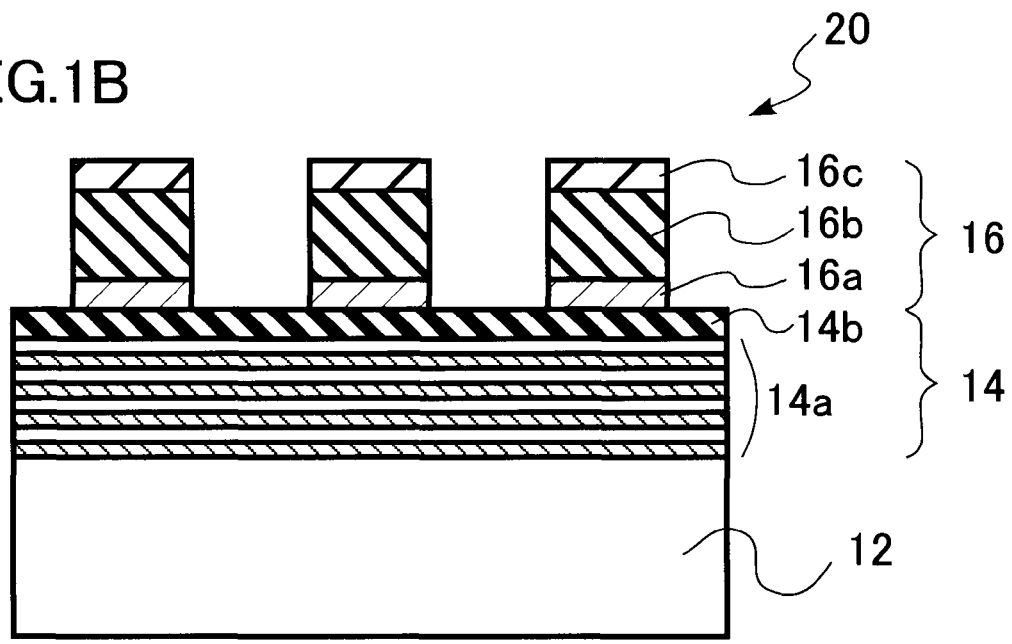

FIG. 1A and FIG. 1B are cross sectional diagrams of the mask blank and mask of this embodiment. FIG. 1A shows the mask blank, while FIG. 1B shows a mask which has been manufactured by patterning this mask blank.

As shown in FIGS. 1A and 1B, each of a mask blank 10 and mask 20 of this embodiment includes a substrate 12, a reflecting layer 14 which is provided on this substrate 12 and reflects EUV light, and an absorbent layer 16 which is provided on the reflecting layer 14 and absorbs EUV light. Here, the reflecting layer 14 has higher reflectance with respect to EUV light than that of the absorbent layer 16. The absorbent layer 16 has higher absorptivity for EUV light than that of the reflecting layer 14.

The substrate 12 is formed of, for example, low thermal expansion glass. The reflecting layer 14 has a two-layer structure of multi-reflecting films 14a and a capping film 14b. The multi-reflecting films 14a may include 40 pairs of alternately laminated Mo and Si films. Due to such a layer structure, the reflectance with respect to EUV light can be improved.

The capping film 14b is formed, for example, of $TiO_2$. This capping film 14b functions as a passivation film for the suppression of oxidation of the multi-reflecting films 14a. The capping film 14b is not always formed of $TiO_2$. For example, Si or Ru can be used. Note, however, that the reflectance of ultraviolet ray can be decreased, if $TiO_2$ is used, when ultraviolet rays are used as the inspection light. Therefore, in this embodiment, it is preferred that $TiO_2$ be used for the capping film 14b, from a point of view to improve the contrast at the mask inspection. Further, the thickness of $TiO_2$ is 20±5 nm, thereby effectively decreasing the reflectance of the ultraviolet rays at a wavelength between 150 nm and 300 nm.

This capping film 14b is not an essential element in the structure. However, it is preferred that the capping film be used, from a point of view to passivate the multi-reflecting films 14a and a point of view to enhance the contrast of signal amplitude with respect to the inspection light so as to improve the inspection performance for the mask.

The absorbent film 16 may be formed of a buffer film (or an etching stopper film) 16a, an absorbent film 16b and a reflecting film for inspection light 16c. In this case, the buffer film 16a is provided in order to prevent the lower reflecting layer 14 from being damaged when the absorbent layer 16 is patterned in a predetermined pattern by etching.

The buffer film 16a is formed of a material having high etching resistance when the absorbent film 16b is etched (e.g. CrN, etc.). The absorbent film 16b is formed of a material having high absorption of EUV light (e.g. TaSi). The reflecting film for inspection light 16c is a reflecting film which exists on the uppermost part of the absorbing layer 16 and increases the reflectance of light at a wavelength between 150 nm and 300 nm in the absorbing layer 16. This reflecting film for inspection light 16c is formed of a material having high reflectance of ultraviolet rays at a wavelength between 150 nm and 300 nm (e.g. Cr).

The reflecting film for inspection light 16c is not an essential element in the structure, but is preferably adopted therein from a point of view to enhance the contrast of signal amplitude with respect to the inspection light and so as to improve the inspection performance for the mask.

The buffer film 16a may be formed of not only CrN, but also a material having high etching resistance, such as $SiO_2$, $Al_2O_3$, Cr, etc.

As shown in FIG. 1B, the mask 20 of this embodiment is manufactured by patterning the part of the absorbing layer 16 of the above-described mask blank 10 in a predetermined pattern, for example, a wiring pattern of LSIs. Thus formed mask 20 absorbs EUV light for exposure at the lithography in the patterned part of the absorbing layer 16 where the absorbent layer 16 exists. Further, the EUV light is reflected at the part of the reflecting layer 14 which corresponds to the patterned space of the absorbent layer 16, thus forming the contrast. Due to this contrast, the pattern of the LSI is transferred, for example, onto the photoresist on the wafer.

Figure 2A:
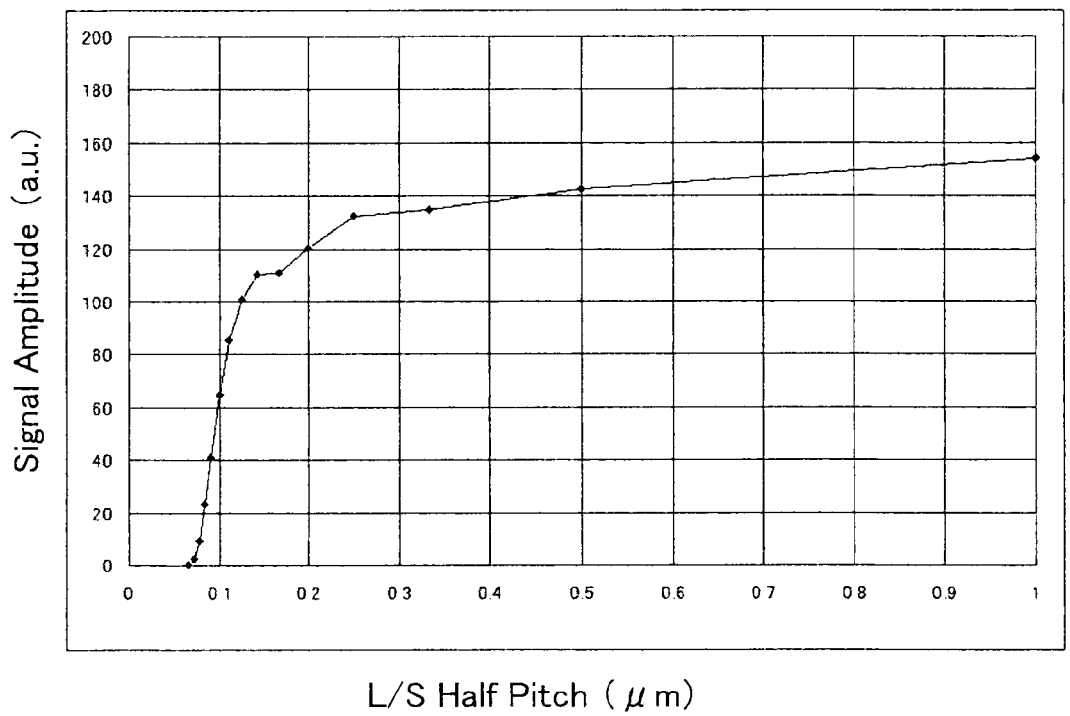
Figure 2A:
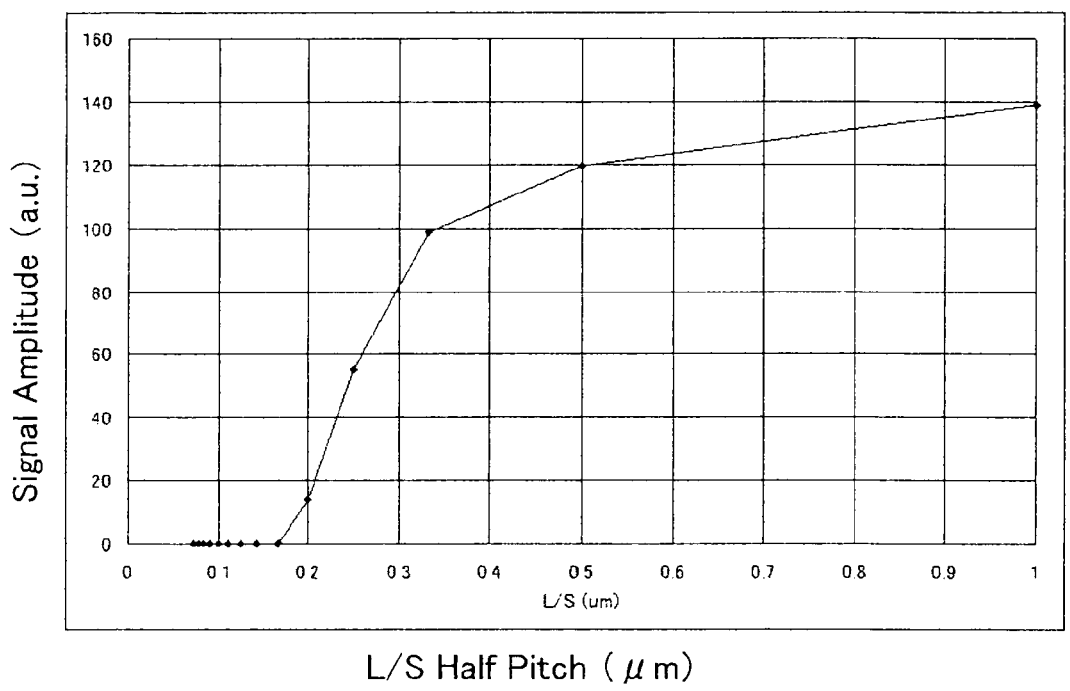

FIGS. 2A and 2B are graphs showing signal amplitude characteristics of the mask inspection obtained using the mask of this embodiment and the previously used related art mask. FIG. 2A is a diagram showing characteristics of the mask of this embodiment which has been formed by processing the mask blank of this embodiment. FIG. 2B is a diagram showing characteristics of the related art mask which has been formed by processing the related art mask blank.

As shown in FIG. 1A and FIG. 1B, the mask of this embodiment has line spaces (L/S) of different pitches, by processing the absorbent layer 16 of the mask blank 10 having the substrate 12 formed of low thermal expansion glass, the reflecting layer 14 and the absorbent layer 16. The reflecting layer 14 has the laminated structure of the multi-reflecting films 14a including 40 pairs of alternately laminated Mo (thickness of 2.8 nm) and Si (thickness of 4.2 nm) films, and the capping film 14b formed of $TiO_2$ having a thickness of 20 nm. The absorbent layer 16 has the laminated structure of the buffer film 16a formed of CrN with a thickness of 10 nm, the absorbent film 16b formed of TaSi having a thickness of 70 nm, and the reflecting film for inspection light 16c formed of Cr having a thickness of 20 nm.

For the mask of this embodiment having the above-described structure, in the case of EUV light, the reflectance percentages of light are approximately 0.2% and 17.8% respectively at the part of the absorbing layer 16 and at the part of the reflecting layer 14. In addition, in the case of ultraviolet light at a wavelength of, for example, 200 nm, the reflectance percentages of light are approximately 44.3% and 15.1% at the respective parts.

Figure 5A:
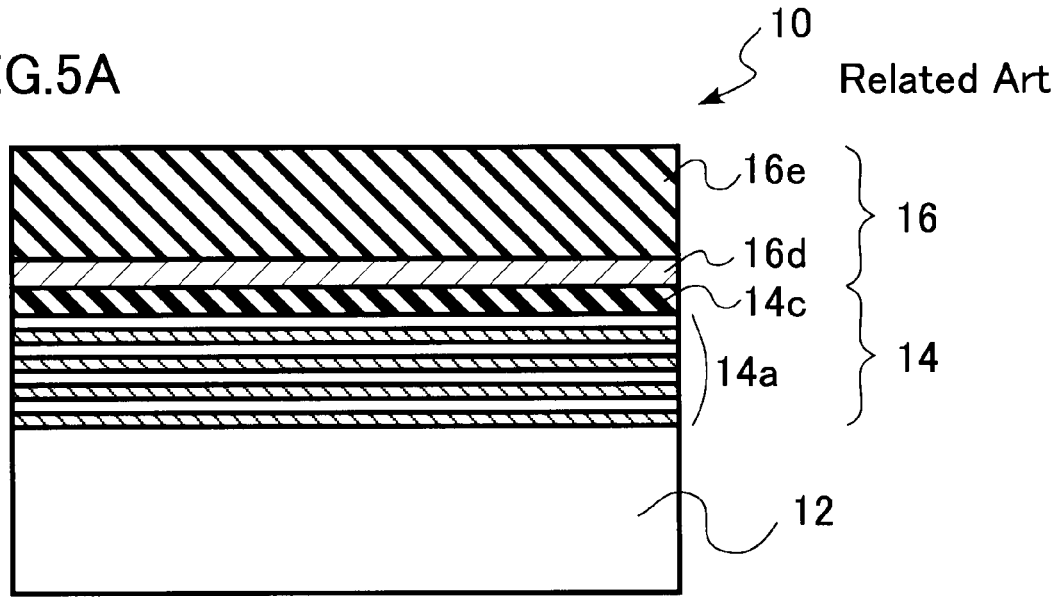
FIG. 5A and FIG. 5B are cross sectional diagrams of a related art mask blank and a related art mask.
Figure 5B:
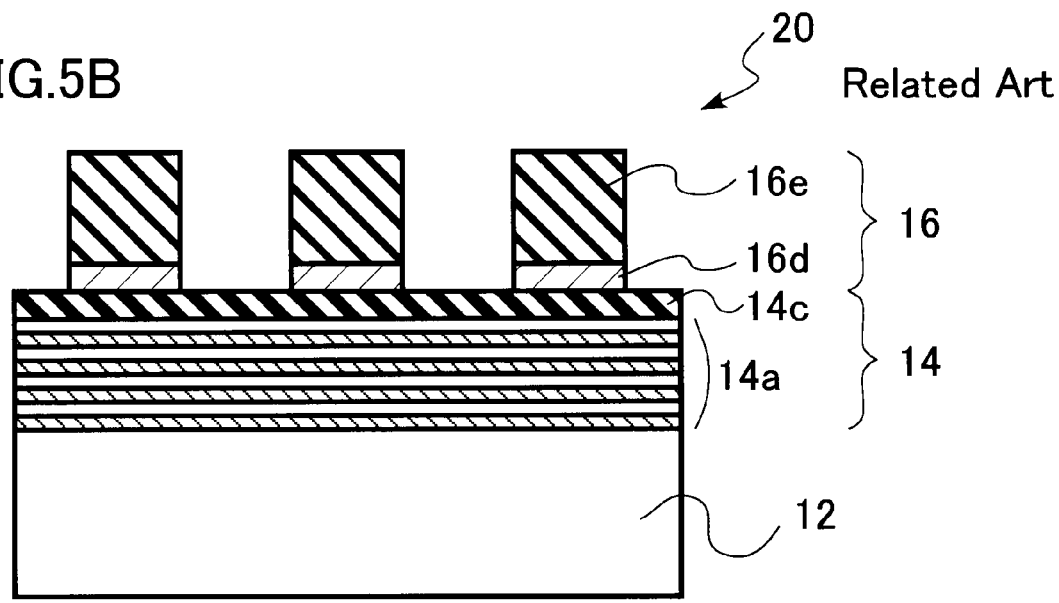

FIGS. 5A and 5B show the structure of the related art mask for the sake of comparison. FIG. 5A shows the related art mask blank, while FIG. 5B shows the related art mask which has been manufactured by processing the related art mask blank. That is, as shown in FIG. 5A and FIG. 5B, the mask has line spaces (L/S) of different pitches, by processing the absorbent layer 16 of the mask blank 10 having the substrate 12 formed of low thermal expansion glass, the reflecting layer 14 and the absorbent layer 16. The reflecting layer 14 has the laminated structure of the multi-reflecting films 14a including 40 pairs of alternately laminated Mo (thickness of 2.8 nm) and Si (thickness of 4.2 nm) films, and the capping film 14c formed of Si with a thickness of 10 nm. The absorbent layer 16 has the laminated structure of a buffer film 16d formed of CrN having a thickness of 10 nm and an absorbent film 16e formed of TaN having a thickness of 70 nm.

In the case of the mask of this related art having the above film structure, in the case of EUV light, the reflectance percentages of light are approximately 0.1% and 44% respectively at the part of the absorbent layer 16 and at the part of the reflecting layer 14. In addition, in the case of ultraviolet light at a wavelength of, for example, 200 nm, the reflectance percentages are approximately 25% and 53% at the respective parts.

FIGS. 2A and 2B show simulation results of signal amplitude characteristics obtained upon application of inspection light at a wavelength of 200 nm to the mask of this embodiment and the related art mask having the above-described film structure. In each of FIGS. 2A and 2B, the horizontal axis represents the half pitch of the line space (L/S) pattern of the mask, while the vertical axis represents the signal amplitude resulting from applying the inspection light.

As shown in FIG. 2B, in the related art case, the signal amplitude remarkably decreases approximately at the half pitch 0.33 μm. In contrast to this, in the case of this embodiment, as shown in FIG. 2A, the signal amplitude does not decrease remarkably until the half pitch 0.15 μm. Accordingly, in the case of the mask of this embodiment, the contrast of the inspection light can be maintained even in the pattern of small pitch, thus improving the inspection performance for the mask.

Figure 3A:
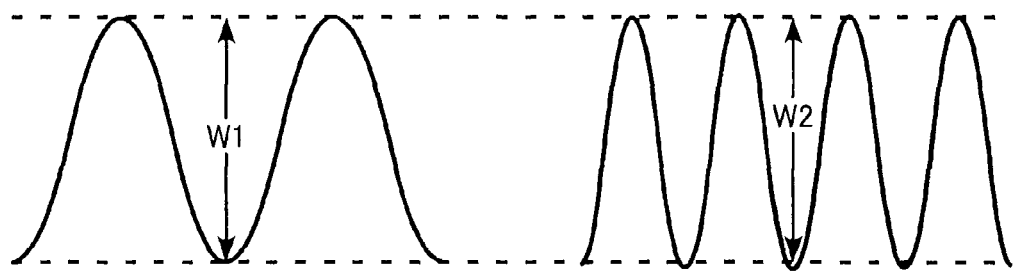
FIG. 3A and FIG. 3B are diagrams showing functions of the mask according to the first embodiment.
Figure 3A:
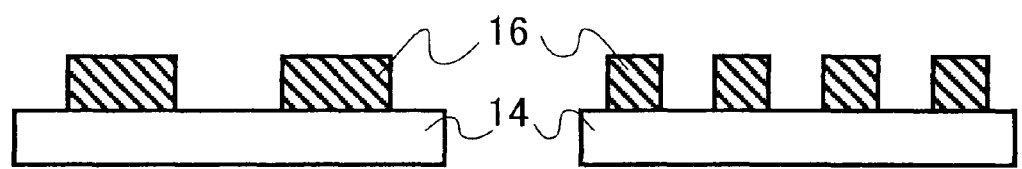
Figure 3B:
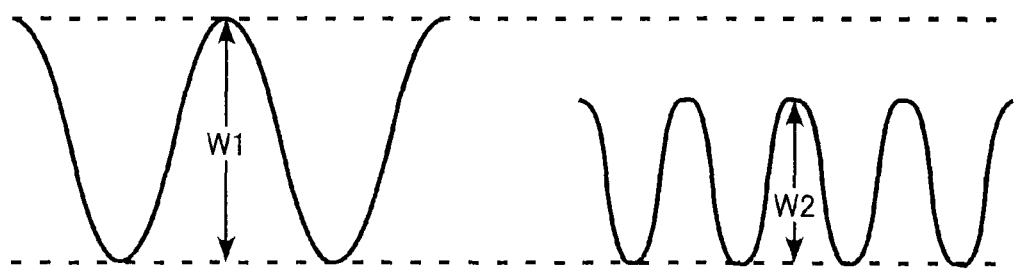
Figure 3B:
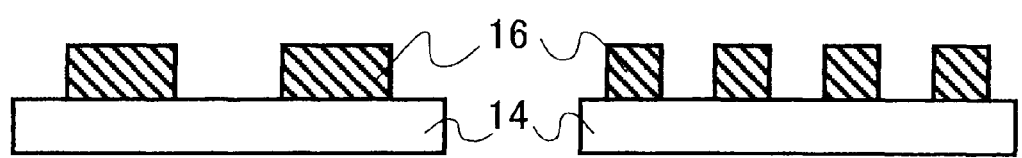

In the mask of this embodiment, the contrast of the inspection light in a small pitch pattern is improved as compared to the related art mask, as follows. FIG. 3A and FIG. 3B are diagram for explaining functions of the mask of this embodiment. FIG. 3A shows the case of this embodiment, while FIG. 3B shows the related art case.

Each of FIG. 3A and FIG. 3B exemplarily shows signal amplitude characteristics both in the case of line spaces (L/S) with a large pitch in the left illustration and in the case of line spaces (L/S) with a small pitch on the right side thereof. Reference symbols W1 and W2 respectively represent the amplitudes in the case of L/S having a large pitch and in the case of L/S having a small pitch.

In the related art, the reflectance of inspection light at the part of the absorbent layer 16 (which is indicated by oblique hatching in FIG. 3B) is lower than that at the lower reflecting layer 14. It is observed that a small amount of inspection light is always reflected from the absorbent layer 16 which corresponds to a line of the pattern regardless of the pitch, if the pitch becomes smaller. On the other hand, reflected light from the reflecting layer 14 without the absorbent layer 16 which corresponds to a space of the pattern is difficult to be reflected as the half pitch approaches the wavelength order of the inspection light. Thus, as shown in the right illustration of FIG. 3B, the amplitude W2 remarkably becomes smaller than the amplitude W1.

In contrast to this, in the case of this embodiment, the reflectance of inspection light at the part of the absorbent layer 16 (which is indicated by oblique hatching in FIG. 3A) is higher than that at the lower reflecting layer 14. It is observed that the inspection light is always reflected regardless of the pitch from the absorbent layer 16 whose reflectance with respect to the inspection light is higher than that of the reflecting layer 14, if the pitch becomes smaller. A small amount of inspection light from the reflecting layer 14 without the absorbent layer 16 is difficult to be reflected, as the half pitch approaches the wavelength order of the inspection light, and thus the small amount of the reflected light remains. Thus, as shown in the right illustration of FIG. 3A, the amplitude W2 will be equal to or very close to the amplitude W1. Even if the pitch becomes smaller, the contrast hardly decreases as compared to the related art.

As described above, the mask of this embodiment has a remarkable effect when the range of the minimum half pitch of the line and the space is equal to or lower than 0.3 μm. Thus, in the mask of this embodiment, it is preferred that the minimum half pitch between the line and the space is equal to or lower than 0.3 μm in a predetermined pattern.

Second Embodiment

A mask blank for EUV exposure (or mask blanks) of a second embodiment of the present invention is the same as that of the first embodiment except that the absorbent layer is a single layer of Cr. Thus, the same descriptions as those of the first embodiment will not be made again in this embodiment.

Figure 4A:
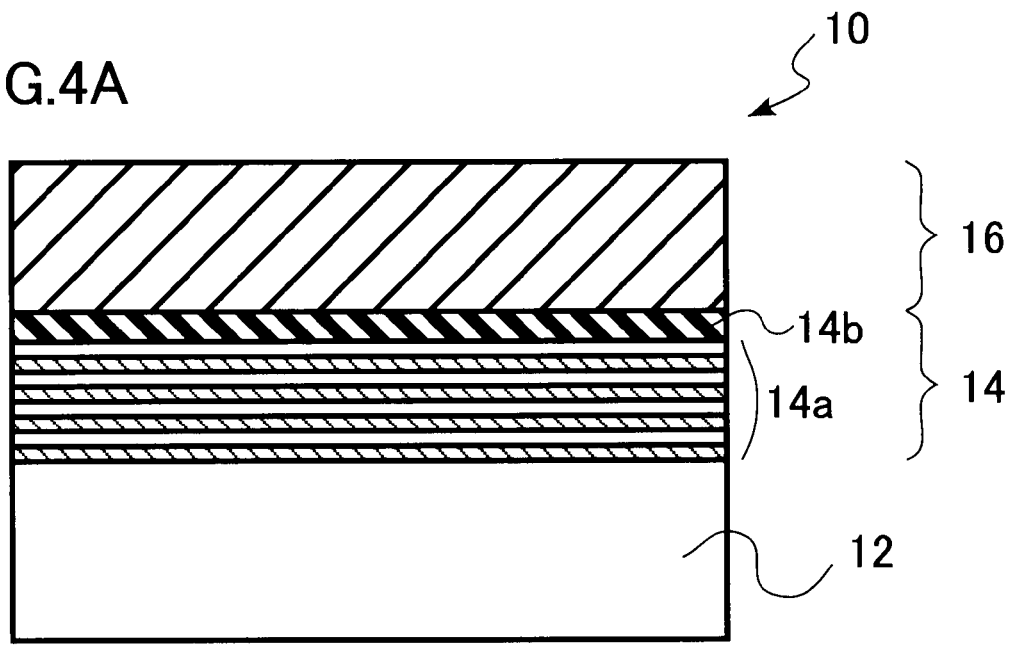
FIG. 4A and FIG. 4B are cross sectional diagrams of a mask blank and mask according to a second embodiment.
Figure 4B:
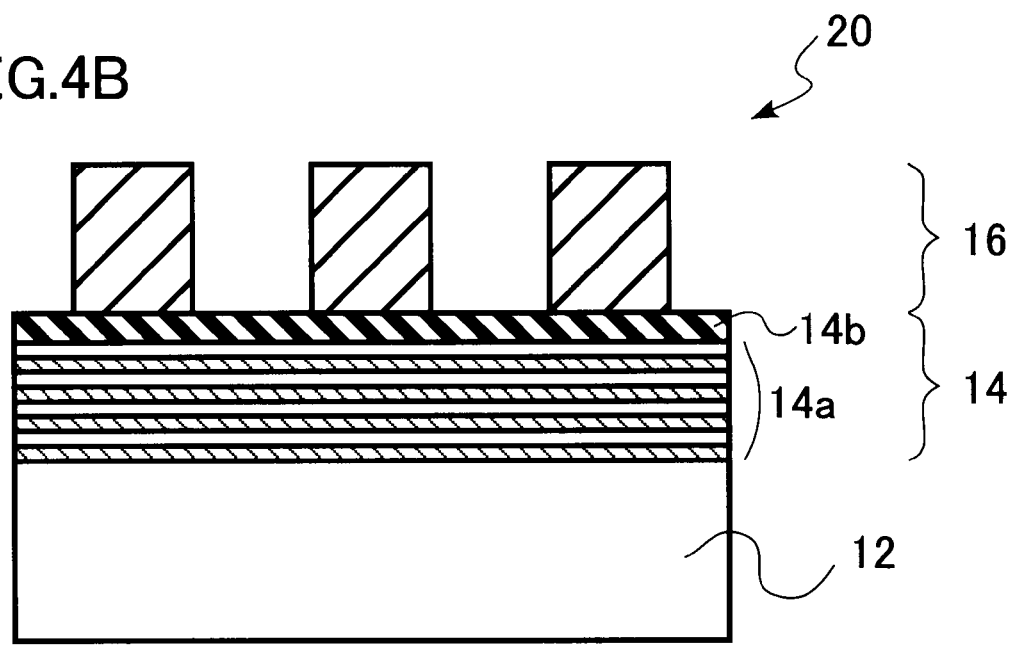

FIG. 4A and FIG. 4B are cross sectional views of a mask blank and mask of this embodiment. FIG. 4A shows the mask blank, while FIG. 4B shows the mask which is manufactured by processing this mask blank.

As described in FIG. 4A and FIG. 4B, each of the mask blank 10 and mask 20 of this embodiment includes the substrate 12, the reflecting layer 14 which is provided on this substrate 12 and reflects EUV light, and the absorbent layer 16 which is provided on the reflecting layer 14 and absorbs EUV light. In this case, the reflectance of the reflecting layer 14 with respect to EUV light is greater than that of the absorbent layer 16. The absorptivity of the absorbent layer 16 with respect to EUV light is higher than that of the reflecting layer 14. The fundamental structures of these are the same as those of the first embodiment.

Unlike the first embodiment that includes the absorbent layer 16 having the laminated structure, the absorbent layer 16 of this embodiment is a single layer of Cr.

According to this embodiment, in addition to the function and effect of the first embodiment, it is possible to realize further function and effect that the mask blank can easily be manufactured in accordance with a simple film deposition process when manufacturing the mask blank, due to the single layer of the absorbent layer. Because the absorbent layer is the single layer, the etching process of the absorbent layer will be simplified when manufacturing the mask, thus attaining the function and effect that the mask is easily manufactured. Further, it is possible to avoid a problem in that mask-processing variations occur when etching a multilayer absorbent layer.

Accordingly, the embodiments of the present invention have been described with reference to the concrete examples. According to these embodiments, it is possible to provide the mask for EUV exposure and the mask blank for EUV exposure for manufacturing the same, so as to improve the contrast of ultraviolet inspection light and improve the inspection performance for the mask. In the above descriptions of the embodiments, descriptions have not been given to the part in the mask blank or mask which is not directly necessary in the present invention. However, any constituent element of a necessary mask blank or mask can suitably be selected and used.

Other and all mask blanks and masks including the elements of the present invention and modified by those skilled in the art are intended to come within the scope of the present invention.

What is claimed is:

1. A mask blank for EUV exposure comprising:

a substrate;

a reflecting layer which is provided on the substrate and reflects EUV light, the reflecting layer including a two-layer structure of a multi-reflecting film and a capping film formed on the multi-reflecting film; and an absorbent layer which is provided on the reflecting layer and absorbs EUV light, the absorbing layer including a buffer film, an absorbent film formed on the buffer film, and a reflecting film that reflects inspection light formed on the absorbent film; and wherein the multi-reflecting film includes about 40 pairs of alternately laminated Mo films having a thickness of about 2.8 nm and Si films having a thickness of about 4.2 nm, the capping film is $TiO_2$ film having a thickness of about 20 nm, the buffer film is a CrN film having a thickness of about 10 nm, the absorbent layer is a TaSi film having a thickness of about 70 nm, and the reflecting film is a Cr film having a thickness of about 20 nm.

2. A mask for EUV exposure comprising:

a substrate;

a reflecting layer which is provided on the substrate and reflects EUV light, the reflecting layer including a two-layer structure of a multi-reflecting film and a capping film formed on the multi-reflecting film; and an absorbent layer which is provided on the reflecting layer and has a predetermined pattern for absorbing EUV light, the absorbing layer including a buffer film, an absorbent film formed on the buffer film, and a reflecting film that reflects inspection light formed on the absorbent film; and wherein the multi-reflecting film includes about 40 pairs of alternately laminated Mo films having thickness of about 2.8 nm and Si films having thickness of about 4.2 nm, the capping film is $TiO_2$ film having a thickness of about 20 nm, the buffer film is a CrN film having a thickness of about 10 nm, the absorbent film is a TaSi film having a thickness of about 70 nm, and the reflecting film is a Cr film having a thickness of about 20 nm.

3. The mask according to claim 2, wherein a minimum half pitch of a line and a space is equal to or lower than 0.3 μm in the predetermined pattern.

* * * * *